United States Patent
Smythe et al.

(10) Patent No.: US 11,127,830 B2
(45) Date of Patent: Sep. 21, 2021

(54) APPARATUS WITH MULTIDIELECTRIC SPACERS ON CONDUCTIVE REGIONS OF STACK STRUCTURES, AND RELATED METHODS

(71) Applicant: Micron Technology, Inc., Boise, ID (US)

(72) Inventors: John A. Smythe, Boise, ID (US); Silvia Borsari, Boise, ID (US); Francois H. Fabreguette, Boise, ID (US); Sutharsan Ketharanathan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/251,063

(22) Filed: Jan. 17, 2019

(65) Prior Publication Data
US 2020/0235005 A1    Jul. 23, 2020

(51) Int. Cl.
   *H01L 29/423*    (2006.01)
   *H01L 21/311*    (2006.01)

(52) U.S. Cl.
   CPC .. *H01L 29/42376* (2013.01); *H01L 21/31111* (2013.01)

(58) Field of Classification Search
   CPC ........... H01L 29/6656; H01L 29/66553; H01L 29/42376; H01L 21/823468; H01L 21/823864
   See application file for complete search history.

(56) References Cited

U.S. PATENT DOCUMENTS

| | | |
|---|---|---|
| 7,426,067 B1 | 9/2008 | Bright et al. |
| 7,855,123 B2 | 12/2010 | Lee et al. |
| 8,129,289 B2 | 3/2012 | Smythe et al. |
| 8,288,268 B2 | 10/2012 | Edelstein et al. |
| 9,385,028 B2 | 7/2016 | Nemani et al. |
| 9,396,989 B2 | 7/2016 | Purayath et al. |
| 9,570,316 B2 | 2/2017 | Lee et al. |
| 9,984,977 B2 | 5/2018 | Dutta et al. |
| 2007/0161240 A1 | 7/2007 | Purtell et al. |
| 2009/0289296 A1* | 11/2009 | Jeon ...................... H01L 29/513 257/321 |

(Continued)

OTHER PUBLICATIONS

Hoofman et al., Alternatives to Low-k Nanoporous Materials: Dielectric Air-Gap Integration, Sold State Technology, vol. 49, Issue 8, (Aug. 2006), 6 pages.

*Primary Examiner* — Lauren R Bell
(74) *Attorney, Agent, or Firm* — TraskBritt

(57) ABSTRACT

Apparatus (e.g., semiconductor devices) include stack structures with at least one conductive region and at least one nonconductive material. A multidielectric spacer is adjacent the at least one conductive region and comprises first and second dielectric materials. The first dielectric material, adjacent the at least one conductive region, includes silicon and nitrogen. The second dielectric material, adjacent the first dielectric material, comprises silicon-carbon bonds and defines a substantially straight, vertical, outer sidewall. In methods to form such apparatus, the first dielectric material may be formed with selectivity on the at least one conductive region, and the second dielectric material may be formulated and formed to exhibit etch resistance.

14 Claims, 6 Drawing Sheets

(56) References Cited

U.S. PATENT DOCUMENTS

| | | | |
|---|---|---|---|
| 2010/0062592 A1* | 3/2010 | Clark | H01L 29/6656 438/591 |
| 2011/0312173 A1* | 12/2011 | Jeon | H01L 29/7881 438/594 |
| 2012/0241836 A1* | 9/2012 | Kuge | H01L 27/11524 257/316 |
| 2014/0159132 A1 | 6/2014 | Daycock et al. | |
| 2014/0299997 A1 | 10/2014 | Sandhu et al. | |
| 2016/0240385 A1* | 8/2016 | Citla | H01L 21/02071 |
| 2018/0135183 A1* | 5/2018 | Zeng | G03F 1/22 |

* cited by examiner

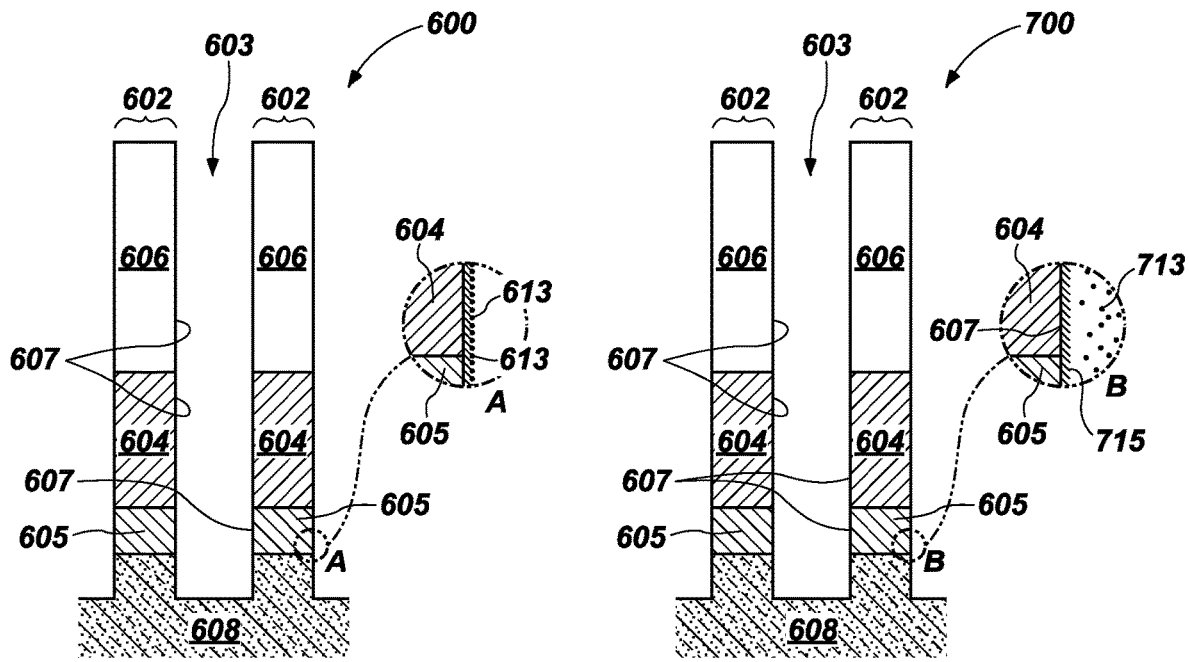
FIG. 6  FIG. 7
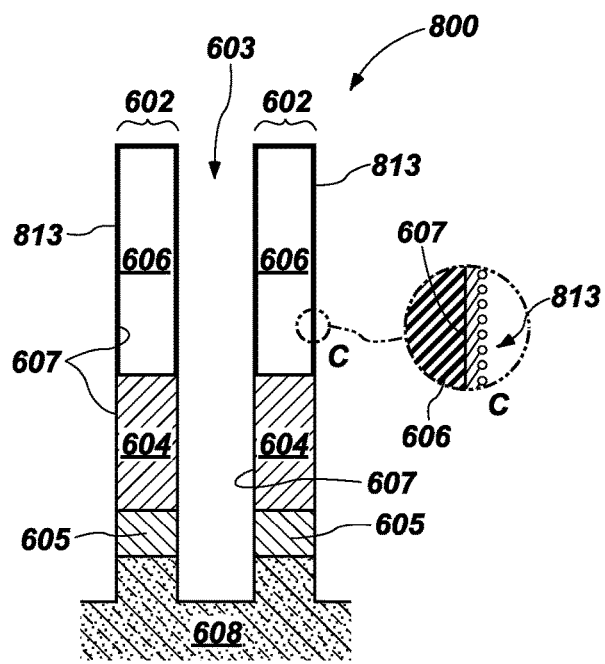
FIG. 8

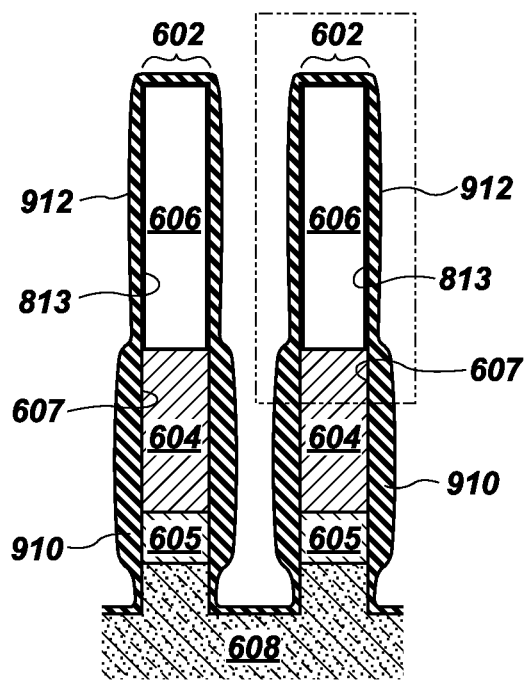
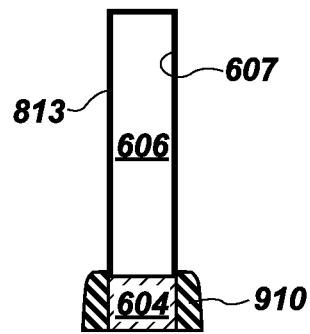
FIG. 9
FIG. 9B
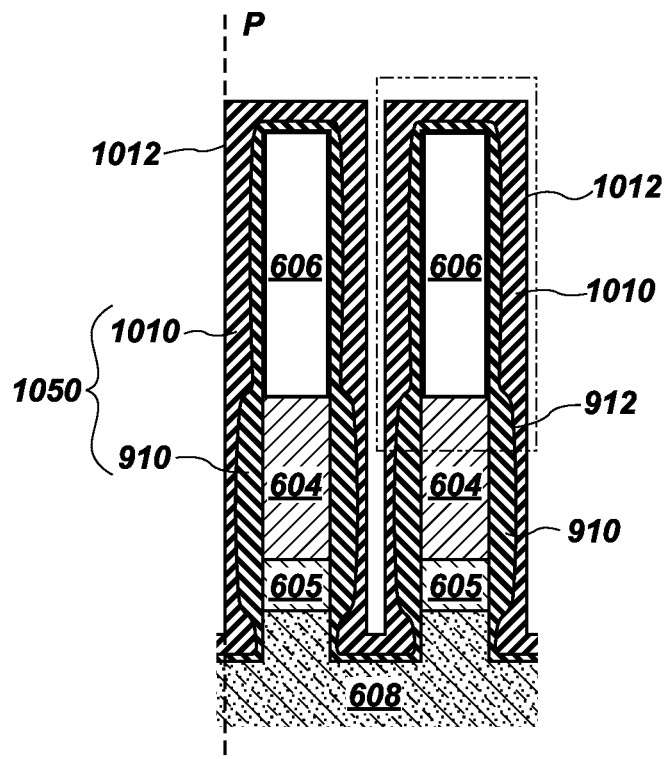
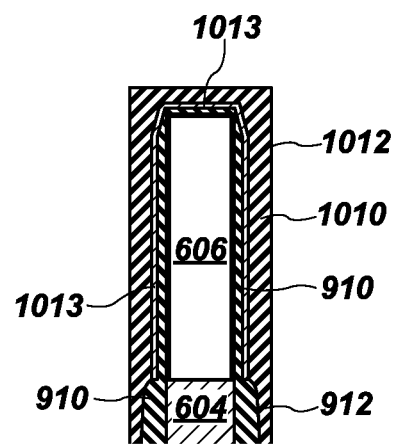
FIG. 10
FIG. 10B

APPARATUS WITH MULTIDIELECTRIC SPACERS ON CONDUCTIVE REGIONS OF STACK STRUCTURES, AND RELATED METHODS

TECHNICAL FIELD

The disclosure, in various embodiments, relates generally to apparatus (e.g., semiconductor devices) with conductive regions. More particularly, this disclosure relates to apparatus (e.g., comprising semiconductor devices) having high aspect ratio "stack" structures that include conductive regions insulated from neighboring conductive regions by dielectric spacers.

BACKGROUND

In the design and fabrication of semiconductor devices, such as memory devices (e.g., DRAM memory devices, flash memory devices) and logic devices, designers are challenged to increase device density (e.g., increased proximity of features). As density increases, ensuring conductive materials (e.g., of conductor lines (e.g., digit lines, access lines, word lines, bit lines)) of neighboring structures remain electrically insulated from one another becomes challenging. Efforts have been made to electrically insulate neighboring conductive regions by forming electrically insulating material regions (e.g., "spacers") on the "stack" structures comprising the regions. However, forming these spacers often requires tradeoffs, such as between the spacer material's dielectric constant (e.g., a factor in the electrical insulation capabilities of the spacer), conformality (e.g., the ability to form the spacer conformally over previous materials), mechanical strength (e.g., a factor in the spacer's ability to maintain its physical structure during subsequent processing), and etch resistance (e.g., the spacer material's ability to avoid degradation during subsequent material-removal processes). For example, selecting a spacer material with sufficient electrical insulation properties (e.g., a sufficient dielectric constant) may complicate efforts to form that material into a conformal, uniform, vertical spacer region on the underlying stack structure, particularly if, e.g., the spacer material more readily forms on nonconductive materials than on conductive materials. As another example, a spacer material with a sufficient dielectric constant may be prone to degradation during subsequent etch processes, degrading the spacer formed of such material, and leaving the conductive regions of the stack structure without adequate electrical insulation.

FIGS. 1, 2, and 3 schematically illustrate challenges that may be encountered using conventional spacer materials and fabrication processes. A stack structure 102 may include a conductive region 104, a hard mask region 106, and semiconductor material 108. Conventional spacer material, used to form a spacer 110 according to conventional methods, may be less prone to nucleate or otherwise form on the conductive region 104 than on the non-conductive material of the hard mask region 106 and of the semiconductor material 108. Thus, as illustrated in FIG. 1, the spacer 110 may be thinner—and therefore less electrically insulative—along the conductive region 104 than along the hard mask region 106. As another example, FIG. 2 illustrates a stack structure 202 in which previous fabrication stages (e.g., etching) formed defects in the stack's sidewall, such as undercuts 207 between a first conductive region 204 and another conductive region 205 and different transverse widths of the conductive regions 204, 205. These defects may translate to corresponding narrower portions and recesses 209 in a spacer 210, if formed with conventional materials and according to conventional methods. As another example, FIG. 3 illustrates a stack structure 302 having an undesirable concave sidewall 307 along a conductive region 304, which concavity may have resulted from an etching stage to form the stack structure 302. A corresponding concave portion 309 in a spacer 310 may result, if forming the spacer 310 by conventional methods and with conventional materials. In each of the examples, a sidewall of the spacer (e.g., sidewall 112 of spacer 110 (FIG. 1), sidewall 212 of spacer 210 (FIG. 2), sidewall 312 of spacer 310 (FIG. 3)) deviates from an ideal, consistent, vertical surface, represented by the dashed line P.

The aforementioned challenges may present even greater difficulties as stack structure arrays become more densely packed, with narrower spaces between neighboring structures. Thus, the realities of the inconsistencies and defects in underlying stack structures and the tradeoffs between desirable properties of spacer structures and materials continues to present challenges in forming semiconductor devices, having both conductive and nonconductive regions, with sufficient, consistent electrical insulation between.

BRIEF DESCRIPTION OF THE DRAWINGS

FIGS. 6 through 10 are cross-sectional, elevational, schematic illustrations during various stages of processing to fabricate arrayed semiconductor devices with conductive regions electrically insulated by a multidielectric spacer defining substantially straight, vertical, outer sidewalls, according to an embodiment of the disclosure. Within FIGS. 6 through 10, FIG. 9B illustrates an alternative stage to that of FIG. 9, and FIG. 10B illustrates an elaboration of the stage of that of FIG. 10 according to an embodiment of the disclosure.

DETAILED DESCRIPTION

Figure 1:
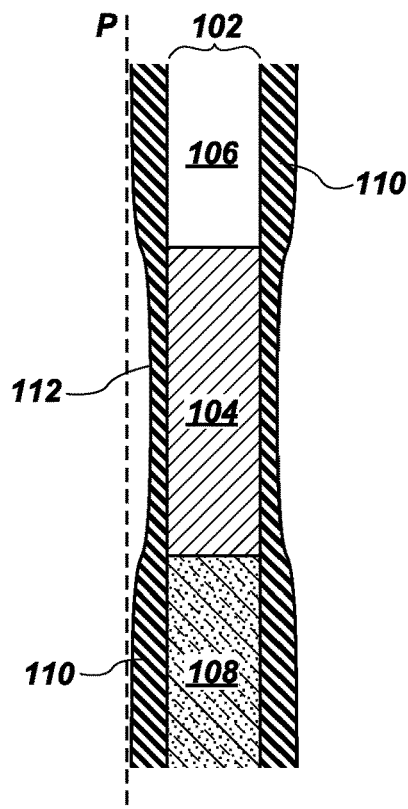
FIG. 1 is a cross-sectional, elevational, schematic illustration of a semiconductor device structure with a conductive region and a spacer, the spacer having been formed using conventional materials and methods.
Figure 2:
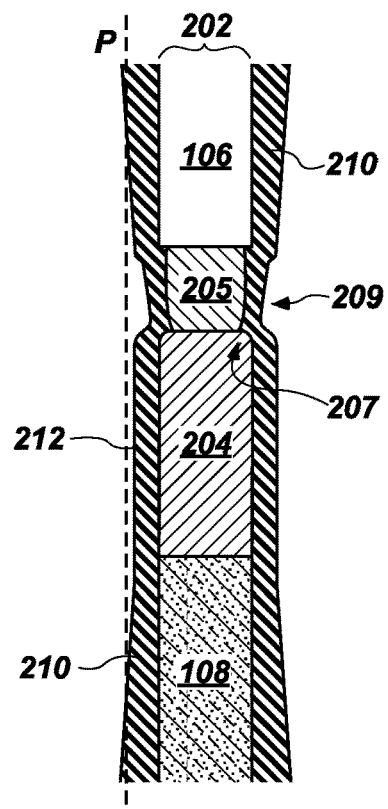
FIG. 2 is a cross-sectional, elevational, schematic illustration of a semiconductor device structure with conductive regions and a spacer, the spacer having been formed using conventional materials and methods.
Figure 3:
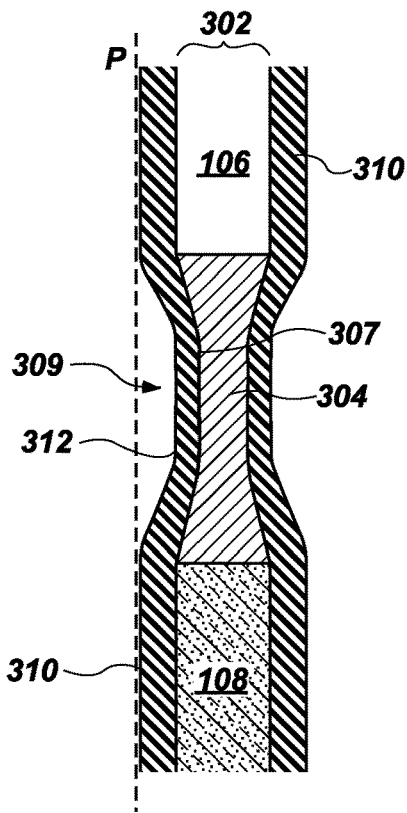
FIG. 3 is a cross-sectional, elevational, schematic illustration of a semiconductor device structure with a conductive region and a spacer, the spacer having been formed using conventional materials and methods.

Methods of the disclosure enable forming spacers with substantially vertical sidewalls, or otherwise sufficient coverage adjacent (e.g., on) conductive regions, despite underlying stack structures having both conductive and nonconductive regions and even if the underlying stack structures have defects along their sidewalls. The disclosed spacers are formed of multiple dielectric materials, including a first dielectric material and a second dielectric material. The first dielectric material is formulated and formed so as to form selectively on the conductive regions of the underlying stack structure, ensuring adequate electrical insulation along the region most needing electrical insulation. The second dielectric material is formulated and formed so that the multidielectric spacer defines a substantially straight, vertical, outer sidewall and exhibits etch resistance to ensure the multidielectric spacer maintains its integrity during subsequent processing.

As used herein, the term "multidielectric spacer" means and includes a region of more than one dielectric material spacing (e.g., separating) an adjacent conductive region of one semiconductor structure (e.g., a stack structure (e.g., of an array)) from a neighboring conductive region of another semiconductor structure (e.g., another stack structure (e.g., of the array)).

As used herein, the term "stack structure" means and includes a structure comprising material regions overlaying one another. Sidewalls of each region may align with one another.

As used herein, the term "arrayed" when describing structures, means and includes structures of an arrangement defining a nonrandom order.

As used herein, the term "apparatus" may include, for example and without limitation, semiconductor devices (e.g., memory devices (e.g., DRAM memory devices, flash memory devices), logic devices) and semiconductor structures (e.g., structures within semiconductor devices).

As used herein, the terms "longitudinal" or "vertical" mean and include a direction that is perpendicular to a primary surface or plane over which a referenced material or structure is located. The height of a respective region or material may be defined as a dimension in a vertical plane.

As used herein, the terms "vertical sidewall" or "vertical surface" mean and refer to a sidewall or surface extending in a substantially vertical direction relative to a primary surface or plane on which the structure with the sidewall or surface is disposed.

As used herein, the terms "lateral" or "horizontal" mean and include a direction that is parallel to a primary surface or plane over which the referenced material or structure is located. The width and length of a respective region or material may be defined as dimensions in a horizontal plane.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0% met, at least 95.0% met, at least 99.0% met, or even at least 99.9% met.

As used herein, the terms "substantially straight," when referring to a sidewall or surface, means and includes a sidewall or surface defining an outer profile that does not deviate from a straight line or that deviates from the straight light by no more than 10.0%, no more than 5.0%, no more than 1.0%, or even no more than 0.1%, such percentage being relative to a dimension at the sidewall or surface along one side of the feature that has such sidewall or surface, rather than, the percentage being relative to the critical dimension of the feature that has such sidewall or surface.

As used herein, the term "substrate" means and includes a base material or other construction upon which components, such as those within semiconductor memory devices or semiconductor logic devices, may be formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions on or in the base semiconductor structure or foundation.

As used herein, the terms "thickness," "thinness," or "height" mean and include a dimension in a straight-line direction that is normal to a plane of the closest surface of an immediately adjacent material or region of different composition, unless otherwise indicated.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate" is a spatially relative term used to describe disposition of one material, region, or sub-region near to another material, region, or sub-region. The term "proximate" includes dispositions of indirectly adjacent to, directly adjacent to, and internal to.

As used herein, the term "neighboring," when referring to a material or region, means and refers to a next, most proximate material or region of an identified composition or characteristic. Materials or regions of other compositions or characteristics than the identified composition or characteristic may be disposed between one material or region and its "neighboring" material or region of the identified composition or characteristic. For example, a conductive region "neighboring" another conductive region is the conductive region, e.g., of a plurality of conductive regions, that is next most proximate to the particular aforementioned conductive region. The "neighboring" material or region may be directly or indirectly proximate the region or material of the identified composition or characteristic.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "comprises," "comprising," "includes," and/or "including" specify the presence of stated features, regions, stages, operations, elements, materials, components, and/or groups, but do not preclude the presence or addition of one or more other features, regions, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

As used herein, the terms "configured" and "configuration" mean and refer to a size, shape, material composition, orientation, and arrangement of a referenced material, region, structure, assembly, or apparatus so as to facilitate a referenced operation or property of the referenced material, region, structure, assembly, or apparatus in a predetermined way.

The illustrations presented herein are not meant to be actual views of any particular structure, region, material, component, device, apparatus, or method stage, but are merely idealized representations that are employed to describe embodiments of the disclosure.

The following description provides specific details—such as material types, material thicknesses, and processing conditions—in order to provide a thorough description of embodiments of the disclosed structures and methods. However, a person of ordinary skill in the art will understand that the embodiments of the structures and methods may be practiced without employing these specific details. Indeed, the embodiments of the structures and methods may be practiced in conjunction with conventional semiconductor fabrication techniques employed in the industry.

The fabrication processes described herein do not form a complete process flow for processing semiconductor devices. The remainder of the process flow (including stages preceding those illustrated and stages following those illustrated) is known to those of ordinary skill in the art. Accordingly, only the methods, materials, and structures necessary to understand embodiments of the present devices, structures, systems, and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

Reference will now be made to the drawings, where like numerals refer to like components throughout. The drawings are not necessarily drawn to scale.

Figure 4:
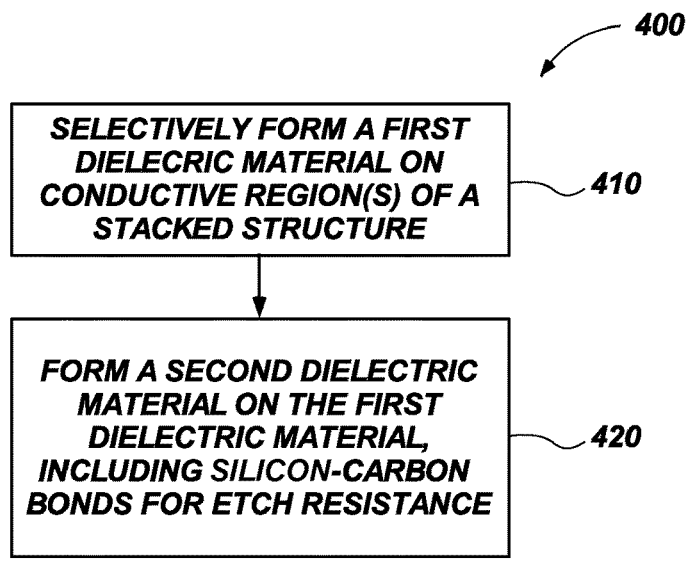
FIG. 4 is a flow chart of a method for forming a multidielectric spacer on arrayed semiconductor devices with at least one conductive region, according to an embodiment of the disclosure.

FIG. 4 charts a method 400 for forming a multidielectric spacer according to an embodiment of the disclosure. After materials and regions of stack structures have been formed and patterned, a first dielectric material is formed on at least conductive regions of the stack structures (stage 410). The first dielectric material is formulated, and the method is tailored, to form the first dielectric material with selectivity on the conductive materials of the conductive region(s). After forming the first dielectric material, a second dielectric material is formed on the first dielectric material (stage 420). The second dielectric material, having silicon-carbon bonds, is formulated to be etch resistant, enabling it and the first dielectric material it covers to be resistant to subsequent processing. In addition, the method for forming the second dielectric material may be tailored to achieve a substantially straight, vertical, outer sidewall for the multidielectric spacer, even if underlying surfaces of the stack structure or the first dielectric material are not substantially straight, vertical surfaces. The processes for stages 410 and 420 are discussed in more detail, below, in association with FIGS. 9 through 16.

Figure 5:
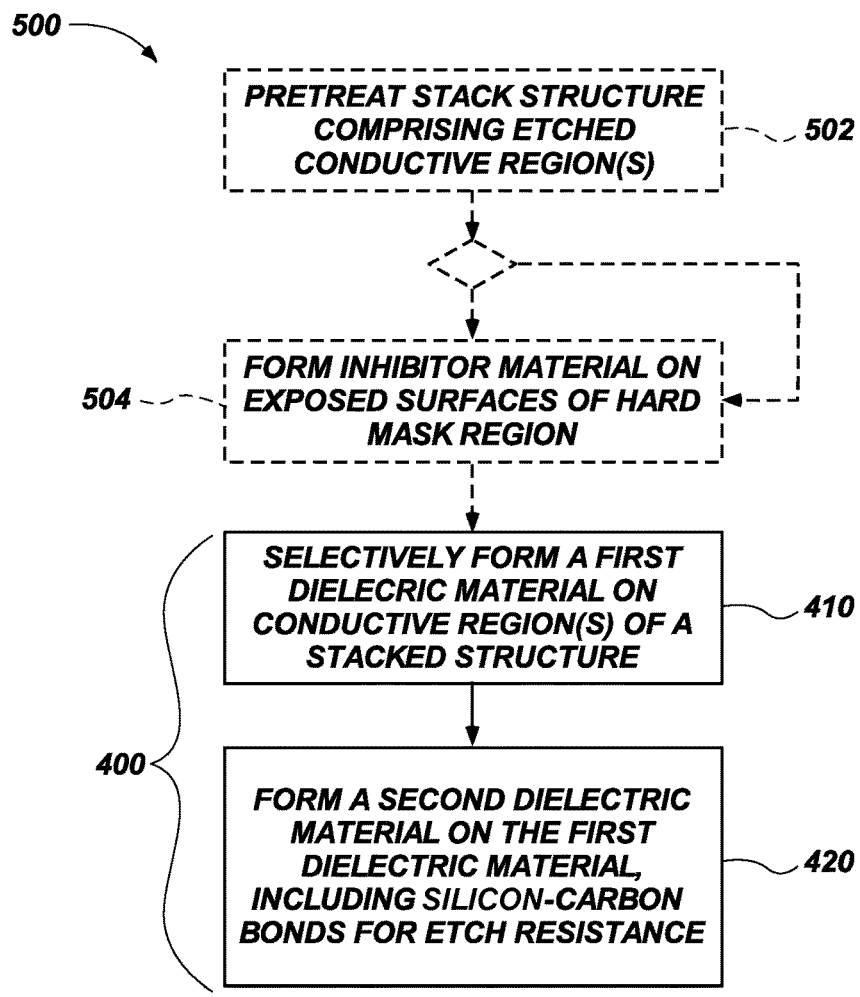
FIG. 5 is a flow chart of a method for forming a multidielectric spacer on arrayed semiconductor devices with at least one conductive region, according to an embodiment of the disclosure, wherein forming a first dielectric material may be preceded by either or both of a pretreatment stage and an inhibitor-formation stage.
Figure 11:
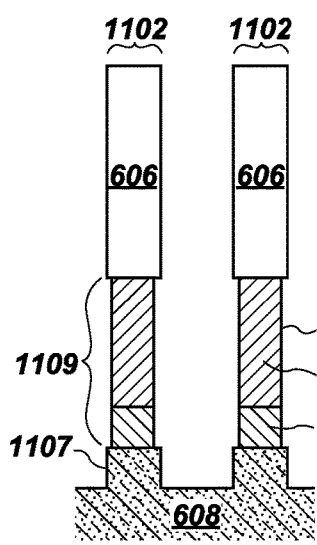
FIGS. 11 through 13 are cross-sectional, elevational, schematic illustrations during various stages of processing to fabricate arrayed semiconductor devices with conductive regions electrically insulated by a multidielectric spacer defining substantially vertical sidewalls, according to an embodiment of the disclosure.

With reference to FIG. 5, in some embodiments, the method 400 of FIG. 4 may be preceded by either, both, or neither of a pretreatment (stage 502) and formation of an "inhibitor" material (stage 504). These optional stages of a method 500 for forming a multidielectric spacer may modify exposed surfaces of, e.g., conductive materials prior to forming the first dielectric material. The surface modification enhances the selectivity of the first dielectric material for forming on the conductive materials. The processes for stages 502 and 504 are discussed in more detail, below, in association with FIGS. 6 through 8.

With reference to FIG. 6, a precursor structure 600 of stack structures 602 (e.g., an array of the stack structures 602) may be formed, e.g., by sequentially forming the materials of the stack structures and then patterning the materials to form the stack structures 602 (e.g., in the array). Neighboring stack structures 602 may be separated by openings 603 defined by sidewalls 607 of the stack structures 602. The stack structures 602 include at least one conductive region (e.g., a conductive region 604 and another conductive region 605) over a semiconductor material 608 (e.g., material of a semiconductor substrate) with a hard mask region 606 above the conductive regions 604, 605. The at least one conductive region (e.g., the conductive region 604 and the other conductive region 605) may comprise, consist essentially of, or consist of a metal, a metal alloy, or other conductive material. For example, the materials of the conductive regions 604, 605 may be one or more of tungsten (W), tungsten silicide ($WSi_x$), titanium (Ti), titanium nitride (TiN), and conductively-doped silicon (Si).

Forming the precursor structure 600 may include forming the material of the other conductive region 605 on the semiconductor material 608 (e.g., a semiconductor substrate), forming the material of the conductive region 604 on the other conductive region 605, forming the material of the hard mask region 606 on the conductive region 604, and then patterning the formed materials to define the precursor structure 600 with the openings 603 between the stack structures 602 (e.g., of an array).

Each stack structure 602 may define a high aspect ratio (e.g., a height-to-width ratio of at least 15:1). The openings 603 may likewise exhibit such a high-aspect ratio. With such high-aspect ratio structures and openings, using conventional methods may make it challenging to form consistent and effective electrical insulation on the stack structures 602, in the openings 603.

To form a multidielectric spacer, according to embodiments of the disclosure, the precursor structure 600 may, optionally, be subjected to a pretreatment (stage 502 of FIG. 5) to remove unwanted chemical species from or to change undesirable bond terminations on (collectively referred to herein, generally, as "debris") surfaces (e.g., the sidewalls 607) of the precursor structure 600.

With reference to enlarged circle A of FIG. 6, it is contemplated that prior processing stages (e.g., etching) may have left debris 613 along the sidewalls 607, such as along the sidewalls 607 of the conductive regions 604, 605. For example, and without limitation, it is contemplated that the debris 613 may include residual etchant species (e.g., residual fluorine (F)), hydrogen-terminated bonds (H—), hydroxyl-terminated bonds (OH—), or other undesirable species or bond terminations that might interfere with subsequent formation of the materials of the multidielectric spacer. Therefore, the debris 613, if not removed or ameliorated, may detrimentally impact (e.g., interfere with adhesion, formation, or bonding of) the later conformal formation of the first dielectric material on at least the conductive regions 604, 605.

To remove, or otherwise ameliorate, the debris 613, the precursor structure 600 may be subjected to the pretreatment (stage 502 of FIG. 5), which may be otherwise equally characterized as a "surface modification" treatment. In the pretreatment, a gas mixture may be introduced, at high pressure (e.g., about 5 torr (about 0.7 kPa) to about 100 torr (about 13.3 kPa); about 5 torr (about 0.7 kPa) to about 20 torr (about 2.7 kPa)) in the presence of a plasma, to the precursor structure 600 while the precursor structure 600 is at a reduced temperature to form, at least on exposed surfaces of the conductive regions 604, 605 along the sidewall 607, sublimatable compounds including fluorine ("fluorine-containing compounds") and the debris 613. As used in this context, the term "reduced temperature" refers to a temperature below the sublimation temperature of the fluorine-containing compounds.

The gas mixture comprises ammonia ($NH_3$) and at least one fluorine-containing gas (e.g., $NH_3$, HF). The gas mixture may, optionally, also include an inert diluent gas (e.g., one or more of nitrogen ($N_2$) or helium (He)). In some embodiments, the gas mixture may also comprise one or more gases formulated as chemical reduction agents (e.g., hydrogen ($H_2$)).

The gas mixture may be formulated to ensure the formed fluorine-containing compounds will sublime (transition from solid to gaseous form) when the precursor structure 600 is exposed to raised temperatures. Thus, the reduced temperature at which the gas mixture is introduced to the precursor structure 600 may be tailored to be at least below the sublimation temperature of the expected fluorine-containing compounds. The precursor structure 600 may then be exposed to increased temperatures (e.g., temperatures above the sublimation temperature), to sublimate the fluorine-containing compounds, as illustrated in FIG. 7. Sublimated compounds 713, being in gaseous form, may then be purged from the system, leaving a precursor structure 700 with modified surfaces, e.g., along the portion of the sidewalls 607 occupied by the conductive regions 604, 605.

Because the removal of the debris 613 is contemplated to remove only atoms- or molecules-worth of chemical species or compounds, removing the debris 613 by the pretreatment may not significantly alter the dimensions of the precursor structure 700 or of the stack structures 602, relative to the precursor structure 600 and stack structures 602 prior to the pretreatment.

The modified surfaces, such as the sidewalls 607 along the conductive regions 604, 605, may include differently-terminated chemical bonds 715 and/or different chemical compositions as compared to the surfaces (e.g., the sidewalls 607 along the conductive regions 604, 605) prior to the pretreatment (stage 502 (FIG. 5)). The modified surfaces may exhibit improved chemisorption, physisorption, Van Der Waals forces, or the like to enable improved adsorption, adherence, or nucleation of materials during subsequent formation of the first dielectric material on the sidewalls 607 along at least the conductive regions 604.

It is contemplated that the composition of the gas mixture and the pressures and temperatures used during the pretreatment (stage 502 (FIG. 5)) may be tailored and selected, through routine experimentation, to achieve the desired surface modification along the sidewalls 607 of at least the conductive regions 604, 605.

Instead of, before, or following, the pretreatment stage (stage 502 (FIG. 5)), an inhibitor 813 may be applied to at least the sidewalls 607 of non-conductive materials of the precursor structure 700 (FIG. 7). For example, the inhibitor 813 may be formulated, and the inhibitor formation stage may be tailored, to form the inhibitor 813 selectively on the hard mask region 606 (stage 504 (FIG. 5)), providing a precursor structure 800 illustrated in FIG. 8, without forming the inhibitor 813 on the sidewall 607 portion of the conductive regions 604, 605. In other words, the inhibitor 813 may be selective for non-conductive material, relative to conductive material. Applying the inhibitor 813 may inhibit—during subsequent formation of a first dielectric material of the multidielectric spacer—the formation of the first dielectric material on the sidewall 607 portion of the inhibitor 813-covered hard mask region 606, while the first dielectric material forms selectively on the conductive regions 604, 605.

The inhibitor 813 may comprise, consist essentially of, or consist of one or more silane or silane-containing materials (e.g., organosilanes, alkoxysilanes), one or more self-assembled monolayer (SAM) materials, one or more fluoride-containing materials (e.g., thorium fluoride (e.g., $ThF_3$), sulfur hexafluoride ($SF_6$)), or any combination thereof. The composition of the inhibitor 813 may be selected and tailored to enable the inhibitor 813 to remain in place on the hard mask region 606 during the formation of the first dielectric material on the conductive regions 604, 605.

In embodiments in which the application of the inhibitor 813 is preceded by a surface-modifying pretreatment (e.g., FIGS. 6 and 7) forming differently-terminated chemical bonds 715 (FIG. 7) along at least the conductive regions 604, 605, the differently-terminated chemical bonds 715 of the surface-modified portion of the sidewall 607 (e.g., along the conductive regions 604, 605) may be incompatible with forming the inhibitor 813. Thus, the pretreatment (stage 502 (FIG. 5)) may enable or improve the results of the subsequent inhibitor 813 application on the non-conductive materials (e.g., the hard mask region 606) (stage 504 (FIG. 5)).

The presence of the inhibitor 813 on the sidewalls 607 of at least the hard mask region 606, but not on the conductive regions 604, 605, may influence the selectivity of the first dielectric material, which will be subsequently formed on the sidewalls 607. Therefore, the inhibitor 813 may be formulated and tailored to decrease the selectivity of the first dielectric material for the portion of the sidewalls 607 covered with the inhibitor 813.

With reference to FIG. 9, after either or both of the pretreatment (stage 502 of FIG. 5) and the application of the inhibitor 813 (stage 504 of FIG. 5)—or, in some embodiments, without performing either of the pretreatment (stage 502 (FIG. 5)) or the inhibitor application (stage 504 (FIG. 5))—a first dielectric material 910 may be formed (stage 410 (FIGS. 4 and 5)). In embodiments in which no pretreatment or inhibitor application have been performed (method 400 (FIG. 4)), the first dielectric material 910 may be formed over the precursor structure 600 of FIG. 6. In embodiments in which the pretreatment (stage 502 (FIG. 5)) has been performed, but the inhibitor 813 has not been applied, the first dielectric material 910 may be formed over the precursor structure 700 of FIG. 7. Otherwise, in embodiments in which both the pretreatment (stage 502 (FIG. 5)) and the inhibitor application (stage 504 (FIG. 5)) have been performed (e.g., by the method 500 of FIG. 5), the first dielectric material 910 may be formed over the precursor structure 800 of FIG. 8.

The first dielectric material 910 may be thin, defining a thickness along at least the sidewalls 607 of the conductive regions 604, 605 of from about 1 nm to about 3 nm. In embodiments in which the inhibitor 813 was applied, e.g., on the hard mask region 606, the first dielectric material 910—having more selectivity for the conductive regions 604, 605 than for the non-conductive regions (e.g., the hard mask region 606) covered by the inhibitor 813—may form more thickly on the conductive regions 604, 605 than on the hard mask region 606. In some embodiments, the first dielectric material 910 may form a thin layer over the hard mask region 606 (e.g., directly on the inhibitor 813 on the hard mask region 606). In other embodiments, the inhibitor 813 may cause no detectable amount of the first dielectric material 910 to form on the hard mask region 606 (e.g., on the inhibitor 813 on the hard mask region 606), as illustrated in the alternative embodiment of FIG. 9B.

In some embodiments, the first dielectric material 910 may be formed by ALD, e.g., pure thermal ALD (meaning an ALD process without added sources of energy of the likes of plasma, microwaves, electronics, or solar radiation), plasma-enhanced ALD (PE-ALD), pulsed-plasma-enhanced ALD. In other embodiments, the first dielectric material 910 may be formed by CVD.

The first dielectric material 910 may comprise, consist essentially of, or consist of a dielectric material (e.g., a nitride (e.g., silicon nitride, silicon carbon nitride (SiCN)), an oxynitride (e.g., a silicon oxynitride, a silicon carboxy nitride (SiCON))).

ALD precursors for forming the first dielectric material 910 may be selected from the group consisting of silicon bromide, silicon iodide, $SiH_4$, $CH_4$, and silanes (e.g., organosilanes, high-order silanes (e.g., trisilylaminesilane, chlorosilane,), polycarbosilanes (e.g., $SiH_2CH_2$, bis-dichloro disilapentane, tetra-dichloro disilapentane), polydimethylsilanes, dimethyldichlorosilane, phenylmethyldichlorosilane, vinylic and chloromethyl silanes (e.g., vinylmethyldichlorosilane), hydridopolycarbosilane (e.g., using $LiAlH_4$ catalyst), hexamethylcyclotetrasiloxane (HMCTS), octamethylcyclotetrasiloxane (OMCTS), tetramethylcyclotetrasiloxane (TMCTS), tetramethyldisilizane (TMDZ), hexamethyldisilizane (HMDZ)). One or more such precursors may be used, and the selected precursors may be tailored according to the composition of the first dielectric material 910 to be formed. For example, to form the first dielectric material 910 as a silicon nitride or silicon oxynitride, the silicon bromide or silicon iodide may be used as the precursors. As another example, to form the first dielectric material 910 as a silicon nitride or silicon carbide, one or more of the $SiH_4$, $CH_4$, or silane-based precursors may be selected and used.

In some embodiments, plasma may be used during, after, or both during and after the ALD formation process to tailor characteristics of the first dielectric material 910. Additionally or alternatively, other mix gases (e.g., nitrogen ($N_2$), helium (He), hydrogen ($H_2$)) may be introduced during the formation to further tailor the characteristics of the first dielectric material 910. Such tailorable characteristics may include the conformality, selectivity (e.g., for the conductive regions 604, 605 relative to the non-conductive regions (e.g., the hard mask region 606)), etch resistance, the effective resistance of the conductive regions 604, 605, and the effective k value of the first dielectric material 910.

For example, an embodiment of forming the first dielectric material 910 of one or more of silicon nitride and silicon oxynitride may include using a silicon bromide or a silicon iodide precursor and an ammonia reagent in a pure-thermal ALD process at temperatures below 400° C. (e.g., between about 150° C. to about 250° C.).

The first dielectric material 910, having a composition as described herein and formed according to a method described herein, may be tailored to selectively form along the sidewalls 607 at the conductive regions 604, 605. Thus, as illustrated in FIGS. 9 and 9B, the first dielectric material 910, as formed, may be tailored, in some embodiments, to define a greater thickness adjacent the conductive regions 604, 605, than adjacent other portions of the stack structures 602. In some such embodiments, the thickness of the first dielectric material 910 along, for example, the hard mask region 606 may be less than about 1 nm (e.g., FIG. 9). In other such embodiments, none of the first dielectric material 910, or an undetectable amount of the first dielectric material 910, may form on the hard mask region 606 (e.g., FIG. 9B). Accordingly, the first dielectric material 910 may be formulated, and the formation stage may be tailored, to selectively form on the conductive material of the conductive regions 604, 605, enabling electrical insulation along the most pertinent section of the stack structures 602. In such embodiments, the first dielectric material 910 may define a sidewall 912 (e.g., an outer sidewall) that is not substantially straight and vertical along the whole of the sidewalls 607 of the stack structures 602.

In some embodiments, an "air break" (e.g., exposure of the precursor structure 800 of FIG. 8 to ambient air) may be included after forming the first dielectric material 910. In such embodiments, exposing the precursor structure 800 to air may incorporate additional oxygen within the first dielectric material 910. In some such embodiments, for example, the first dielectric material 910 of the precursor structure 800 of FIG. 8 may comprise silicon nitride, and the first dielectric material 910 may be at least partially or completely converted to silicon oxynitride or may be at least partially or completely converted to silicon dioxide by the exposure to air.

After forming the first dielectric material 910 with the desired selectivity for at least the conductive regions 604, 605—and either without or after the air break—a second dielectric material 1010 may be formed over the first dielectric material 910 (stage 420 (FIGS. 4 and 5)), as illustrated in FIG. 10.

Though the first dielectric material 910 may define an outer sidewall (e.g., the sidewall 912 (FIG. 9)) that is not a substantially straight, vertical sidewall, the multidielectric spacer may nonetheless be formed to exhibit a substantially straight, vertical sidewall along its outer vertical surface, which may be defined by an outer sidewall of another dielectric material of the multidielectric spacer (e.g., along a second dielectric material 1010 (FIGS. 10 and 10B)).

The second dielectric material 1010 may be formed, conformally, over a whole of the first dielectric material 910. In some embodiments, such as that illustrated in FIGS. 10 and 10B, the first dielectric material 910 may be subjected to an additional treatment, prior to forming the second dielectric material 1010, to tailor the selectivity of the second dielectric material 1010 so that it will form with more selectivity (e.g., at a greater thickness) on the thinner portions of the first dielectric material 910 (e.g., adjacent the hard mask region 606), relative to its formation on thicker portions of the first dielectric material 910 (e.g., adjacent the conductive regions 604, 605).

For example, as illustrated in FIG. 10B, in some embodiments a selectivity-enhancing material 1013 may be formed on only the thinner portions of the first dielectric material 910 (e.g., adjacent the hard mask region 606), without forming on the thicker portions of the first dielectric material 910 (e.g., adjacent the conductive regions 604, 605), to increase the rate of forming the second dielectric material 1010 along the thinner portions of the first dielectric material 910. Forming the selectivity-enhancing material 1013 with selectivity on the thinner portions of the first dielectric material 910 may be enabled by a difference in surface energy of the first dielectric material 910 along its thinner portions than along its thicker portions. The different surface energies may result from the previous formation of the first dielectric material 910, as described above. The different surface energies may then influence how subsequent material (e.g., the selectivity-enhancing material 1013) physisorbs or chemisorbs to the first dielectric material 910, promoting the selective formation of the selectivity-enhancing material 1013 on the thinner portions of the first dielectric material 910 relative to the thicker portions of the first dielectric material 910. Therefore, the composition of the selectivity-enhancing material 1013 may be tailored to exhibit the selectivity for forming on the thinner portions of the first dielectric material 910, given the different surface energy along the thinner portions.

In an embodiment in which the selectivity-enhancing material 1013 is formed on the thinner portions of the first dielectric material 910, the selectivity-enhancing material 1013 may comprise alkoxysilane, which may have been formed by exposing polysiloxane networks to light energy from, e.g., plasma. The alkoxysilane may form with selectivity on the thinner portions of the first dielectric material 910 due to the aforementioned difference in surface energies (e.g., a difference in the density of bond terminations along the surface). The presence of the alkoxysilane of the selectivity-enhancing material 1013 on the thinner portions of the first dielectric material 910 may enhance nucleation of the second dielectric material 1010 on the selectivity-enhancing material 1013 so that the second dielectric material 1010 forms more thickly adjacent the thinner portions of the first dielectric material 910 on which the alkoxysilane-comprising material was formed.

In other embodiments in which the selectivity-enhancing material 1013 is formed on the thinner portions of the first dielectric material 910, the selectivity-enhancing material 1013 may comprise, consist of, or consist essentially of a polypyrrole, a polyaniline, or both. The polypyrrole and the polyaniline may, therefore, be used to enhance the ability to tune the relative selectivity for forming the second dielectric material 1010 on the first dielectric material 910.

In some embodiments, rather than applying the selectivity-enhancing material 1013 on the thinner portions of the first dielectric material 910, another inhibitor may be applied on only the thicker portions of the first dielectric material 910 (e.g., adjacent the conductive regions 604, 605), without forming on the thinner portions of the first dielectric material 910 (e.g., adjacent the hard mask region 606), to decrease the rate of forming the second dielectric material 1010 along the thicker portions of the first dielectric material 910. Forming such other inhibitor may again may enabled by a difference in surface energy of the first dielectric material 910 along its thinner portions than along its thicker portions. However, in this embodiment, the different surface energies may promote the selective formation of the other inhibitor on the thicker portions of the first dielectric material 910 relative to the thinner portions of the first dielectric material 910. Therefore, the composition of the other inhibitor may be tailored to exhibit the selectivity for forming on the thicker portions of the first dielectric material 910, given different surface energy along the thicker portions.

In an embodiment in which the other inhibitor is formed, the other inhibitor may consist of, consist essentially of, or comprise octadecyltrichlorosilane (ODTS). The ODTS may be formed on the thicker portions of the first dielectric material 910 with covalent silicon-oxygen (Si—O) bonding between the molecules of the ODTS and the surface (e.g., the sidewall 912) of the thicker portions of the first dielectric material 910. The presence of the ODTS on the thicker portions of the first dielectric material 910 may inhibit subsequent formation of the second dielectric material 1010 on those portions.

In other embodiments, the other inhibitor may comprise, consist essentially of, or consist of one or more poly (phenylene-vinylene) compound, e.g., poly(phenylene-vinylene), poly(p-phenylenevinylene), poly(1,4-phenylenevinylene), or combinations thereof. The presence of such other inhibitor material on the thicker portions of the first dielectric material 910 may inhibit subsequent formation of the second dielectric material 1010 on those portions.

In some embodiments, the formation of the selectivity-enhancing material 1013 on the thinner portions of the first dielectric material 910, the formation of the other inhibitor on the thicker portions of the first dielectric material 910, or both may be more of a surface-modification treatment than formation of a new material or layer over the respective portions of the first dielectric material 910. Nonetheless, the surface-modification treatment may enable the selective formation of the second dielectric material 1010 at a greater thickness over the thinner portions of the first dielectric material 910 than over the thicker portions of the first dielectric material 910. For example, the structure of FIG. 9 may be subjected to a treatment that exposes the outer surface of the first dielectric material 910 to vapor phase ammonia with a hydrofluorosilicic acid source, which may replace hydrogen-bonding terminations along the surface of the thinner portions of the first dielectric material 910 with hydroxyl-bonding terminations along that surface. The replacement of hydrogen-bonding (H-bonding) with hydroxyl-bonding (OH-bonding) at the surface alters the hydrophilic or hydrophobic nature of the surface, promoting selective formation of the second dielectric material 1010 on the modified surface.

In still another example, both the selectivity-enhancing material 1013 may be formed along the thinner portions of the first dielectric material 910 and the other inhibitor may be formed along the thicker portions of the first dielectric material 910 before the second dielectric material 1010 is formed more thickly over the selectivity-enhancing material 1013 (e.g., adjacent the hard mask region 606) and more thinly over the other-inhibitor (e.g., adjacent the conductive regions 604, 605).

Regardless as to whether the second dielectric material 1010 forms at different thicknesses in different areas due to the selectivity-enhancing material 1013 adjacent the hard mask region 606, due to the other inhibitor adjacent the conductive regions 604, 605, or a combination of both, the resulting second dielectric material defines, as illustrated in FIGS. 10 and 10B, a greater thickness (e.g., between about 1 nm thickness to about 3 nm thickness) along the hard mask region 606 than along the conductive regions 604, 605 (e.g., at a thickness of less than about 1 nm). By tailoring the relative selectivity of the second dielectric material in these regions of the sidewall 607 (FIG. 9), a sidewall 1012 of the second dielectric material 1010 may be formed to define a substantially straight, vertical, outer sidewall for a multidielectric spacer 1050.

The second dielectric material 1010 is formulated to comprise a detectable amount of carbon, namely carbon bonded to silicon (e.g., Si—C bonds). The second dielectric material 1010 may include at least about 5 at. % carbon. In some embodiments, the second dielectric material 1010 comprises carbon while the first dielectric material 910 is substantially free of (e.g., does not comprise) carbon.

The second dielectric material 1010 may be formed by, for example, ALD (e.g., pure thermal ALD, PE-ALD, pulsed-plasma-enhanced ALD), CVD (e.g., CVD without plasma, plasma-enhanced CVD (PE-CVD)), using one or more precursors. The precursors for forming the second dielectric material 1010 may be selected from the group consisting of silane ($SiH_4$), methane ($CH_4$), octamethylcyclotetrasiloxane (OMCTS) with an $O_2$ oxidant, trimethylsilane (3MS), tetramethylsilane (4MS), bis-trimethylsilylmethane (BTMSM), tetramethylcyclotetrasiloxane (TMCTS), bis-trimethylsilylmethane (BTMSM, $C_7H_{20}Si_2$), methyltriethoxysilane (MTES, $C_7H_{18}O_3Si$), methyltrimethoxysilane (MTMS), mexamethylcyclotetrasiloxane (HMCTS), polycarbosilanes (e.g., $SiH_2CH_2$, bis- or tetra-dichloro-disilapentane), polydimethylsilanes, dimethyldichlorosilane, phenylmethyldicholorosilane, vinylic and chloromethyl silanes (e.g., vinylmethyldichlorosilane), hydridopolycarbosilane using a $LiAlH_4$ catalyst, hexamethylcyclotetrasiloxane (HMCTS), oxtamethylcyclotetrasiloxane (OMCTS), tetramethylcyclotetrasiloxane (TMCTS), tetramethyldisilizane (TMDZ), hexamethyldisilizane (HMDZ).

Temperatures for forming the second dielectric material 1010 may be in the range of from about 250° C. to about 450° C.

In some embodiments, the second dielectric material 1010 may comprise silicon, carbon, oxygen, and hydrogen (e.g., a SiOCH material). However, it is contemplated that the second dielectric material 1010, as well as the first dielectric material 910, may be free of the class of SiOCH materials known in the art as "porous low-k" materials. Rather, the second dielectric material 1010 may comprise a SiOCH material with Si—O—Si, Si—, Si—H, O—H, C—H, and Si—$CH_3$ bond structures. For example, the second dielectric material 1010 may comprise, consist essentially of, or consist of $(SiOC_2H_6)_4$ (otherwise known in the art as $[(CH_3)_2SiO]_4$).

With the carbon of the silicon-carbon bonds present in the second dielectric material 1010, the second dielectric material 1010 may be formulated to be etch resistant. That is, subsequent exposure of the second dielectric material 1010 to etchants, e.g., fluorine-based etchants (e.g., HF gas), may result in removal of no more than one monolayer of the second dielectric material 1010, e.g., less than about 2 angstroms (less than about 2 Å (less than about 0.2 nm)). Accordingly, while the first dielectric material 910 enables improved formation (e.g., greater thickness and conformality) on the conductive regions 604, 605 of the stack structures 602, the second dielectric material 1010 provides etch resistance to the multidielectric spacer 1050. Thus, the resulting multidielectric spacer 1050 may exhibit the desired conformality, structure (e.g., substantially straight, vertical, outer sidewalls 1012), and properties (e.g., electrical resistance and etch resistance) without having to sacrifice one desirable property for another.

Accordingly, disclosed is an apparatus comprising at least one stack structure. The at least one stack structure comprises at least one conductive region between nonconductive materials. A multidielectric spacer is adjacent the at least one conductive region. The multidielectric spacer comprises a first dielectric material and a second dielectric material. The first dielectric material is adjacent the at least one conductive region. The first dielectric material comprises silicon and nitrogen. The second dielectric material is directly adjacent the first dielectric material. The second dielectric material comprises silicon-carbon bonds. The second dielectric material comprises carbon at at least five atomic percent. The multidielectric spacer defines a substantially straight, vertical, outer sidewall.

In some embodiments, either or both of the first dielectric material 910 formation stage (stage 410 (FIGS. 4 and 5)) and the second dielectric material 1010 formation stage (stage 420 (FIGS. 4 and 5)) may further include use of a plasma-enhanced chamber with exposure to a gas comprising helium, nitrogen ($N_2$), a carbon source, or other bond-modifying gas to further tailor the characteristics of one or both of the first dielectric material 910 and the second dielectric material 1010.

Accordingly, disclosed is a method of forming an apparatus comprising insulated conductive regions. The method comprises forming a first dielectric material on stack structures. The stack structures comprise at least one conductive region and at least one nonconductive region. The first dielectric material is formulated to form selectively on the at least one conductive region, relative to the at least one nonconductive region. A second dielectric material is formed on the first dielectric material. The second dielectric material comprises silicon-carbon bonds. The second dielectric material defines a substantially straight, vertical, outer sidewall.

While the stack structures 602 of the embodiment of FIGS. 6 through 10 exhibited substantially straight, vertical sidewalls (e.g., sidewall 607 (FIGS. 6 through 8)), in other embodiments, such as those illustrated in FIGS. 11 through 16, prior processing stages may have left a stack structure 1102 with a recess portion 1109 (FIG. 11) of the sidewall 1107 along, e.g., conductive regions (e.g., conductive region 1104, and another conductive region 1105). The first dielectric material 910 may be formed to substantially or completely fill the recess portion 1109, defining a substantially straight, vertical, outer sidewall.

Figure 12:
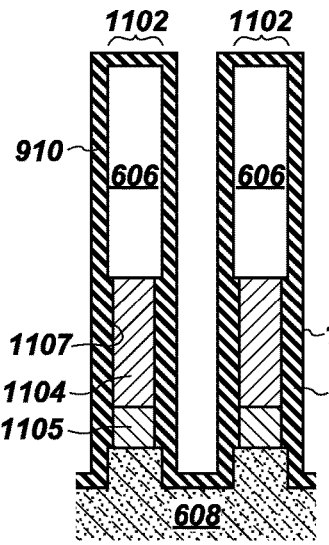
Figure 13:
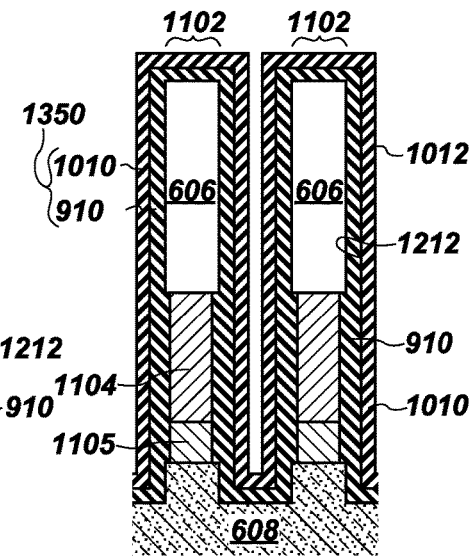

For example, with reference to FIG. 12, in some embodiments in which no inhibitor has been formed on the hard mask region 606—and either after or without performing the pretreatment (stage 502 (FIG. 5), FIGS. 6 and 7)—the first dielectric material 910 may be formed directly on the hard mask region 606 and exposed portions of the sidewall 1107 along the conductive regions 1104, 1105, defining a greater thickness along the conductive regions 1104, 1105. This greater thickness along the conductive regions 1104, 1105 is achieved because the first dielectric material 910 is formulated and may be formed—e.g., optionally after the pretreatment (e.g., FIGS. 6 and 7)—to exhibit greater selectivity for the conductive regions 1104, 1105 as compared to non-conductive materials (e.g., the hard mask region 606 and the semiconductor material 608). With reference to FIG. 13, the second dielectric material 1010 may then be formed, using any of the compositions and formation methods discussed above, to form a multidielectric spacer 1350 with the substantially straight, vertical, outer sidewall 1012. Because the first dielectric material 910 already defines a substantially straight, vertical, outer sidewall 1212, the second dielectric material 1010 may be conformally formed to a consistent thickness, not substantially varying along the height of the stack structure 1102, on the first dielectric material 910, as illustrated in FIG. 13.

Figure 14:
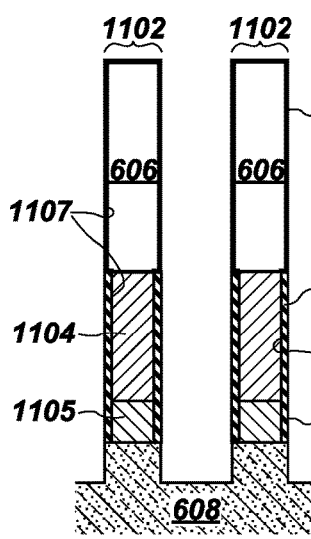
FIGS. 14 and 15, in conjunction with FIG. 11, are cross-sectional, elevational, schematic illustrations during various stages of processing to fabricate arrayed semiconductor devices with conductive regions electrically insulated by a multidielectric spacer defining substantially vertical sidewalls, according to an embodiment of the disclosure.
Figure 15:
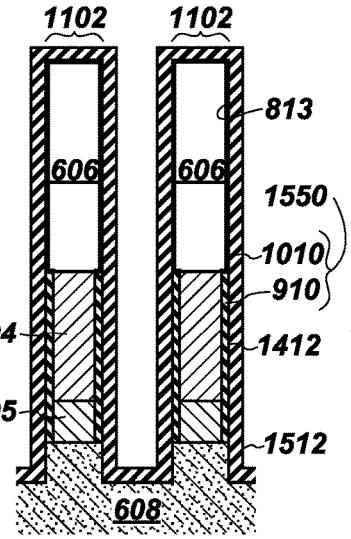

Returning to FIG. 11 and embodiments in which the initial stack structure 1102 defines the recess portion 1109 along the conductive regions 1104, 1105, the inhibitor 813 may be applied—with or without first performing the pretreatment (stage 502 (FIG. 5), FIGS. 6 and 7)—on the hard mask region 606, as illustrated in FIG. 14. In some such embodiments, the first dielectric material 910 may be formed only adjacent the conductive regions 1104, 1105, as also illustrated in FIG. 14. This may be achieved by the formation-inhibiting effects of the inhibitor 813 present on the nonconductive material (e.g., the hard mask region 606, and, in some embodiments, also on the semiconductor material 608 (not shown)). The first dielectric material 910 may, therefore, define a substantially straight, vertical, outer sidewall 1412 that is aligned with (e.g., coplanar with) the sidewall 1107 portions defined by, e.g., the hard mask region 606. With reference to FIG. 15, the second dielectric material 1010 may then be formed, using any of the compositions and formation methods discussed above, to form a multidielectric spacer 1550 with a substantially straight, vertical, outer sidewall 1512.

Figure 16:
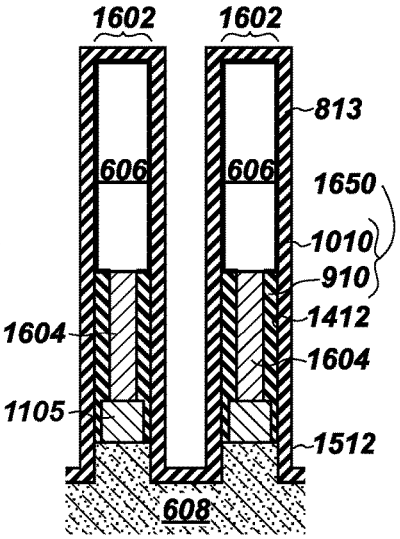
FIG. 16 is a cross-sectional, elevational, schematic illustration during a stage of processing to fabricate arrayed semiconductor devices with conductive regions electrically insulated by a multidielectric spacer defining substantially vertical sidewalls, according to an embodiment of the disclosure.

In still other embodiments, such as that illustrated in FIG. 16, a stack structure 1602 may be patterned in such a manner that a conductive region 1604 defines (e.g., undesirably) a narrower width than the other conductive region 1105. By tailoring, e.g., the pretreatment stage (stage 502 (FIG. 5), FIGS. 6 and 7), by tailoring the formation of the first dielectric material 910 (e.g., tailoring the selection of the precursors or other formation conditions), the first dielectric material 910 may be formed to define a greater thickness along the narrower of the conductive regions, i.e., along the conductive region 1604 compared to how the first dielectric material 910 forms along the other conductive region 1105. Thus, as with the embodiment illustrated in FIG. 14, the first dielectric material 910 may be formed to define the substantially straight, vertical, outer sidewall 1412 extending only along the conductive regions 1104, 1105 and aligning with (e.g., coplanar with) the sidewall 1107 (FIG. 14) portion of the nonconductive regions (e.g., the hard mask region 606 and the semiconductor material 608). The second dielectric material 1010 may then be formed, using any of the compositions and formation methods discussed above, to form a multidielectric spacer 1650 with a substantially straight, vertical, outer sidewall 1512.

After forming the multidielectric spacer (e.g., 1050 (FIG. 10), 1350 (FIG. 13), 1550 (FIG. 15), 1650 (FIG. 16)) the fabrication process may be completed to form the remainder of the materials and regions of the semiconductor devices that comprise the stack structures and spacers. In some embodiments, the subsequent processing stages may include formation of additional insulative material, air gaps, or both between the stack structures (e.g., stack structures 602 (any of FIGS. 6 through 8), 1102 (FIG. 11), 1602 (FIG. 16)). Formation of air gaps may include exhuming all, or portions, of the first dielectric material 910, the second dielectric material 1010, or both that were originally formed laterally adjacent the conductive regions (e.g., conductive regions 604, 605 (FIG. 10), 1104, 1105 (FIGS. 13 and 15), 1604, 1105 (FIG. 16)). Nonetheless, remaining portions of the multidielectric spacer (e.g., multidielectric spacers 1050 (FIG. 10), 1350 (FIG. 13), 1550 (FIG. 15), 1650 (FIG. 16)) may define (e.g., along the hard mask region 606) the substantially straight, vertical, outer sidewall (e.g., 1012 (FIGS. 10, 10B, and 13), 1512 (FIGS. 15 and 16)). And, during such subsequent processing stages (e.g., exhumations, etching stages), the etch resistance of the second dielectric material 1010 may protect the multidielectric spacer (e.g., multidielectric spacers 1050 (FIG. 10), 1350 (FIG. 13), 1550 (FIG. 15), 1650 (FIG. 16)), including the first dielectric material 910 covered by the second dielectric material 1010.

Accordingly, disclosed is a method of forming an apparatus with electrically insulating conductive regions. The method comprises forming at least one conductive material adjacent a nonconductive material and patterning the at least one conductive material and the nonconductive material to define a precursor structure comprising stack structures. The stack structures comprise at least one conductive region of the at least one conductive material. The method also comprises selectively forming a first dielectric material adjacent an exposed surface of the at least one conductive material. The first dielectric material comprises silicon and nitrogen. A second dielectric material is formed adjacent the first dielectric material. The second dielectric material comprises silicon-carbon bonds. The second dielectric material also comprises at least five atomic percent carbon. The second dielectric material defines a substantially straight, vertical, outer sidewall.

Figure 17:
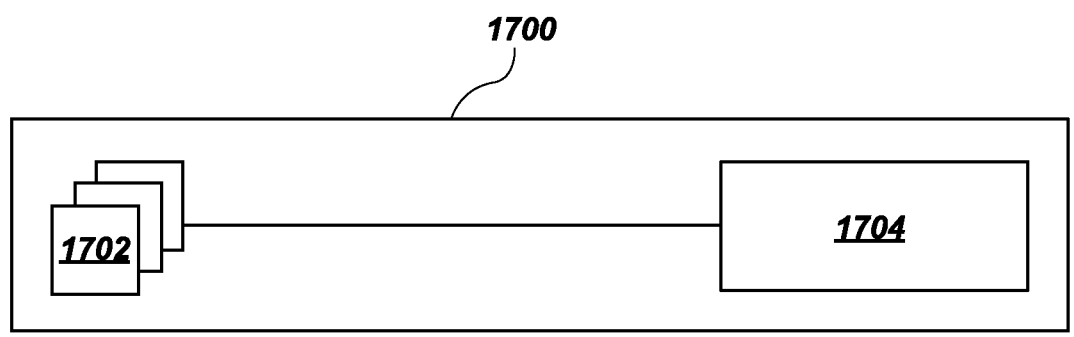
FIG. 17 is a simplified block diagram of a semiconductor device structure including an array of memory or logic devices including multidielectric spacers formed or structured in accordance with any of the embodiments of the disclosure.

With reference to FIG. 17, illustrated is a simplified block diagram of a semiconductor device 1700 implemented according to one or more embodiments described herein. The semiconductor device 1700 includes an array 1702 of stack structures (e.g., stack structures 602 (any of FIGS. 6 through 8), 1102 (FIG. 11), 1602 (FIG. 16)) that include at least one conductive region. The semiconductor device 1700 also includes a control logic component 1704. The array 1702 also includes multidielectric spacers (e.g., multidielectric spacers 1050 (FIG. 10), 1350 (FIG. 13), 1550 (FIG. 15), 1650 (FIG. 16)) formed according to any of the embodiments discussed above. The control logic component 1704 may be configured to interact with the array 1702 so as to read from or write to any or all semiconductor devices within the array 1702.

While the disclosed structures and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. An apparatus, comprising:
   at least one stack structure comprising at least one conductive region directly vertically between
   a first nonconductive material and a second nonconductive material, wherein:
   a lowest region, of the at least one conductive region, is directly vertically above the first nonconductive material, and
   an uppermost region, of the at least one conductive region, is directly vertically below the second nonconductive material; and
   a multidielectric spacer adjacent the at least one stack structure, the multidielectric spacer comprising:
   a first dielectric material extending an entire height of the at least one stack structure and above the at least one stack structure, the first dielectric material comprising silicon and nitrogen, the first dielectric material defining a greater thickness along the at least one conductive region than a thickness of the first dielectric material defined along the first nonconductive material and the second nonconductive material; and
   a second dielectric material directly adjacent the first dielectric material, the second dielectric material comprising silicon-carbon bonds, the second dielectric material comprising carbon at at least five atomic percent,
   an outer sidewall of the multidielectric spacer being substantially straight and vertical,
   wherein the second dielectric material defines a greater thickness along the first nonconductive material and along the second nonconductive material than a thickness of the second dielectric material defined along the at least one conductive region.

2. The apparatus of claim 1, further comprising a silane or silane-containing material between the first dielectric material and the first nonconductive material and between the first dielectric material and the second nonconductive material.

3. The apparatus of claim 1, wherein the first dielectric material is substantially free of carbon.

4. The apparatus of claim 1, wherein the at least one stack structure is a structure with a height-to-width ratio of at least 15:1.

5. A method of forming an apparatus comprising insulated conductive regions, comprising:
   forming a multidielectric spacer adjacent at least one stack structure of the apparatus, the at least one stack structure comprising at least one conductive region directly vertically between a first nonconductive material and a second nonconductive material, wherein a lowest region of the at least one conductive region is directly vertically above the first nonconductive material, and wherein an uppermost region of the at least one conductive region is directly vertically below the second nonconductive material, forming the multidielectric spacer comprising:
   forming a first dielectric material extending an entire height of the at least one stack structure and above the at least one stack structure, the first dielectric material comprising silicon and nitrogen, the first dielectric material formulated to form selectively on the at least one conductive region relative to the first nonconductive material and the second nonconductive material, the first dielectric material defining a greater thickness along the at least one conductive region than a thickness of the first dielectric material defined along the first nonconductive material and the second nonconductive material; and
   forming a second dielectric material directly adjacent the first dielectric material, the second dielectric material comprising silicon-carbon bonds, the second dielectric material comprising carbon at at least five atomic percent, the second dielectric material defining a greater thickness along the first nonconductive material and along the second nonconductive material than a thickness of the second dielectric material along the at least one conductive region,
   wherein an outer sidewall of the multidielectric spacer is formed to be substantially straight and vertical.

6. The method of claim 5, wherein forming a first dielectric material comprises forming, by atomic layer deposition, silicon nitride.

7. The method of claim 6, further comprising, before forming the second dielectric material, exposing the silicon nitride to air to at least partially convert the silicon nitride to silicon oxynitride or silicon dioxide.

8. The method of claim 5, wherein forming a first dielectric material comprises forming the first dielectric material by atomic layer deposition with at least one precursor selected from the group consisting of silicon bromide, silicon iodide, $SiH_4$, $CH_4$, and silanes.

9. The method of claim 8, wherein forming a first dielectric material comprises forming silicon nitride, silicon oxynitride, or silicon carbide.

10. The method of claim 5, further comprising, before forming the first dielectric material:
exposing the at least one stack structure to ammonia, a fluorine-containing gas, and a plasma to form fluorine-containing compounds on an exposed surface of the at least one conductive region; and
removing the fluorine-containing compounds.

11. The method of claim 10, further comprising, after removing the fluorine-containing compounds and before forming the first dielectric material, applying a silane or a silane-containing material to a sidewall of the second nonconductive material.

12. The method of claim 5, further comprising, before forming the first dielectric material, applying a silane or a silane-containing material to an exposed surface of the second nonconductive material.

13. A method of forming an apparatus with electrically insulated conductive regions, the method comprising:
forming at least one stack structure of the apparatus:
forming at least one conductive material directly vertically adjacent a first nonconductive material and a second nonconductive material; and
patterning the at least one conductive material, the first nonconductive material, and the second nonconductive material to define a precursor structure comprising the at least one stack structure comprising at least one conductive region, formed of the at least one conductive material, directly vertically between the first nonconductive material and the second nonconductive material, wherein a lowest region of the at least one conductive region is directly vertically above the first nonconductive material, and wherein an uppermost region of the at least one conductive region is directly vertically below the second nonconductive material; and
forming a multidielectric spacer adjacent the at least one stack structure, forming the multidielectric spacer comprising:
selectively forming a first dielectric material laterally adjacent an exposed surface of the at least one conductive region and selectively forming the first dielectric material laterally adjacent the first nonconductive material and the second nonconductive material to form the first dielectric material extending an entire height of the at least one stack structure and above the at least one stack structure, the first dielectric material comprising silicon and nitrogen, the first dielectric material formed to define a greater thickness along the at least one conductive region than a thickness of the first dielectric material defined along the first nonconductive material and the second nonconductive material; and
forming a second dielectric material directly adjacent the first dielectric material, the second dielectric material comprising silicon-carbon bonds, the second dielectric material comprising at least five atomic percent carbon, the second dielectric material defining a greater thickness along the first nonconductive material and along the second nonconductive material than a thickness of the second dielectric material defined along the at least one conductive region,
wherein an outer sidewall of the multidielectric spacer is formed to be substantially straight and vertical.

14. The method of claim 13, further comprising, forming a silane or a silane-containing material directly adjacent the second nonconductive material before selectively forming the first dielectric material.

* * * * *

UNITED STATES PATENT AND TRADEMARK OFFICE
CERTIFICATE OF CORRECTION

PATENT NO. : 11,127,830 B2  
APPLICATION NO. : 16/251063  
DATED : September 21, 2021  
INVENTOR(S) : John A. Smythe et al.

Page 1 of 1

It is certified that error appears in the above-identified patent and that said Letters Patent is hereby corrected as shown below:

In the Specification  
Column 4, Line 24, change "than, the" to --than, e.g., the--  
Column 4, Line 37, change "("SOT")" to --("SOI")--

Signed and Sealed this  
Ninth Day of November, 2021

Drew Hirshfeld  
*Performing the Functions and Duties of the*  
*Under Secretary of Commerce for Intellectual Property and*  
*Director of the United States Patent and Trademark Office*